(12) United States Patent
Betzin et al.

(10) Patent No.: US 11,125,828 B2
(45) Date of Patent: Sep. 21, 2021

(54) DETERMINING THE AGE OF AN ELECTROCHEMICAL ENERGY STORAGE UNIT

(71) Applicant: Siemens Aktiengesellschaft, Munich (DE)

(72) Inventors: Christopher Betzin, Forchheim (DE); Holger Wolfschmidt, Erlangen (DE)

(73) Assignee: ROLLS-ROYCE DEUTSCHLAND LTD & CO KG, Blankenfelde-Mahlow (DE)

( * ) Notice: Subject to any disclaimer, the term of this patent is extended or adjusted under 35 U.S.C. 154(b) by 299 days.

(21) Appl. No.: 16/327,184

(22) PCT Filed: Aug. 16, 2017

(86) PCT No.: PCT/EP2017/070709
§ 371 (c)(1),
(2) Date: Feb. 21, 2019

(87) PCT Pub. No.: WO2018/036873
PCT Pub. Date: Mar. 1, 2018

(65) Prior Publication Data
US 2019/0187220 A1 Jun. 20, 2019

(30) Foreign Application Priority Data
Aug. 25, 2016 (DE) ...................... 10 2016 215 991.7

(51) Int. Cl.
*G01R 31/392* (2019.01)
*G01R 31/36* (2020.01)
*G01R 31/3835* (2019.01)

(52) U.S. Cl.
CPC ....... *G01R 31/392* (2019.01); *G01R 31/3648* (2013.01); *G01R 31/3835* (2019.01)

(58) Field of Classification Search
CPC .................................................. G01R 31/392
(Continued)

(56) References Cited

U.S. PATENT DOCUMENTS

| 6,388,447 B1 * | 5/2002 | Hall ...................... H02J 7/0047 |
| | | 324/426 |
| 2005/0001625 A1 | 1/2005 | Ashtiani et al. .............. 324/426 |

(Continued)

FOREIGN PATENT DOCUMENTS

| DE | 10 2010 050 980 A1 | 6/2011 | ............ H01M 10/48 |
| DE | 10 2011 005 769 A1 | 9/2012 | ............ G01R 31/36 |

(Continued)

OTHER PUBLICATIONS

Anonymous, "Comparison of Two Curves—My MATLAB Forum—goMatlab.de", URL: http://www.gomatlab.de/vergleich-zweier-kurven-t24025.html, pp. 1-4, Jun. 14, 2012.

(Continued)

*Primary Examiner* — Ricky Go
(74) *Attorney, Agent, or Firm* — Slayden Grubert Beard PLLC

(57) ABSTRACT

Various embodiments include a method for determining the age of an electrochemical energy storage unit comprising: referring to a first open-circuit voltage curve of the electrochemical energy storage unit dependent upon the state of charge of the electrochemical energy storage unit as a reference; ascertaining a second open-circuit voltage curve of the electrochemical energy storage unit dependent upon the state of charge of the electrochemical energy storage unit; and determining the age of the electrochemical energy storage unit by comparing the first and second open-circuit voltage curves.

8 Claims, 2 Drawing Sheets

(58) Field of Classification Search
USPC .......................................................... 702/63
See application file for complete search history.

(56) References Cited

U.S. PATENT DOCUMENTS

| | | | |
|---|---|---|---|
| 2012/0019253 A1 | 1/2012 | Ziegler et al. ................. 324/433 |
| 2013/0030739 A1* | 1/2013 | Takahashi ............ G01R 31/396 |
| | | | 702/63 |
| 2013/0275067 A1* | 10/2013 | Mikuteit ............ G01R 31/3648 |
| | | | 702/63 |
| 2013/0317771 A1* | 11/2013 | Laskowsky ............. B60L 58/12 |
| | | | 702/63 |
| 2016/0006275 A1* | 1/2016 | Lee ...................... G01R 31/382 |
| | | | 320/112 |
| 2019/0187220 A1 | 6/2019 | Betzin et al. |

FOREIGN PATENT DOCUMENTS

| | | | | |
|---|---|---|---|---|
| DE | 10 2013 206 188 A1 | 10/2014 | ............ G01R 31/36 |
| DE | 10 2013 213 253 A1 | 1/2015 | ............ G01R 31/36 |
| DE | 10 2013 217 752 A1 | 3/2015 | ............ G01R 31/36 |
| DE | 10 2015 200 835 A1 | 7/2016 | ............ G01R 31/36 |
| EP | 1 450 172 A1 | 8/2004 | ............ G01R 31/28 |
| EP | 1 450 173 A2 | 8/2004 | ............ G01R 31/36 |
| WO | 2010/084070 A1 | 7/2010 | ............ G01R 31/00 |
| WO | 2010/084072 A1 | 7/2010 | ............ H01M 10/48 |
| WO | 2018/036873 A1 | 3/2018 | ............ G01R 31/36 |

OTHER PUBLICATIONS

German Office Action, Application No. 10 2016 215 991.7, 12 pages, dated Aug. 31, 2017.
International Search Report and Written Opinion, Application No. PCT/EP2017/070709, 22 pages, dated Oct. 23, 2017.

* cited by examiner

DETERMINING THE AGE OF AN ELECTROCHEMICAL ENERGY STORAGE UNIT

CROSS-REFERENCE TO RELATED APPLICATIONS

This application is a U.S. National Stage Application of International Application No. PCT/EP2017/070709 filed Aug. 16, 2017, which designates the United States of America, and claims priority to DE Application No. 10 2016 215 991.7 filed Aug. 25, 2016, the contents of which are hereby incorporated by reference in their entirety.

TECHNICAL FIELD

The present disclosure relates to energy storage. Various embodiments may include methods for determining the age of an electrochemical energy storage unit.

BACKGROUND

In the interests of cost-effective operation, electrochemical energy storage units, specifically those of a lithium-based type, must have a sufficiently long service life. A long service life in terms of both temporal duration, and a high number of cycles, must hereby be ensured. For the determination of the age or aging of an electrochemical energy storage unit, a variety of methods are known from the prior art. Exemplary patent applications include WO 2010 084070 A1, EP 2 389 703 1, and EP 1 450 173 A2.

Specifically, methods for determining the age or aging of an electrochemical energy storage unit are better if they influence the operation thereof to the least possible extent, are limited in duration, generate no additional aging of the electrochemical energy storage unit and, for metrological purposes, require the smallest possible transfer of energy from the electrochemical energy storage unit. It is even better if a method for determining the age of an electrochemical energy storage unit is realized in the form of an autonomous measuring method, which can be executed, for example, by means of a remote control.

The above-mentioned known methods have a disadvantage in that, for the determination of the age of the electrochemical energy storage unit, it is typically necessary for the normal operating mode of the electrochemical energy storage unit to be discontinued. This is specifically the case in impedance spectroscopy, according to patent application EP 2 389 703 A1. The method according to patent application EP 1 450 172 A2, in which the age or aging of an electrochemical energy storage unit is determined by reference to complete charging and discharging cycles, also features this disadvantage. Moreover, methods involving the occasional determination of the age or aging of the electrochemical energy storage unit are typically more prone to error.

SUMMARY

Determining the age of an electrochemical energy storage unit is highly significant, specifically with respect to the operational security of the electrochemical energy storage unit. For example, some embodiments may include a method for determining the age of an electrochemical energy storage unit, comprising: providing a first open-circuit voltage curve (201) of the electrochemical energy storage unit, which is dependent upon the state of charge of the electrochemical energy storage unit, as a reference; ascertaining a second open-circuit voltage curve (202) of the electrochemical energy storage unit, which is dependent upon the state of charge of the electrochemical energy storage unit; and determining the age of the electrochemical energy storage unit by comparing the first and second open-circuit voltage curves (201, 202).

In some embodiments, for comparative purposes, an area (41) between the first and second open-circuit voltage curves (201, 202) is considered.

In some embodiments, the area (41) is constituted by an integral, wherein the lower limit of the integral is determined by an intersection point (51) of the two open-circuit voltage curves (201, 202), and the upper limit of the integral is determined by at least one value for the state of charge.

In some embodiments, the age is determined by means of a proportionality factor to the area (41).

In some embodiments, for comparative purposes, an intersection point (51) of the two open-circuit voltage curves (201, 202) is considered.

In some embodiments, the age is determined with reference to the value for state of charge associated with the intersection point (51), or with reference to the value for the open-circuit voltage associated with the intersection point (51).

In some embodiments, for comparative purposes, a quantitative difference is considered between an open-circuit voltage value on the first open-circuit voltage curve (201) and an open-circuit voltage value on the second open-circuit voltage curve (202), at a specified common value for the state of charge.

In some embodiments, the specified common value for the state of charge lies within the range of 80 percent to 95 percent, and preferably lies specifically within the range of 85 percent to 90 percent.

As another example, some embodiments include an electrochemical energy storage unit comprising a measuring device and a computing device, characterized in that the computing device is configured for the saving of a first open-circuit voltage curve (201), and the measuring device is configured for ascertaining a second open-circuit voltage curve (202), wherein the computing device is further configured to determine the age of the electrochemical energy storage unit by means of a method as claimed in one of the preceding claims.

In some embodiments, the latter is configured as a lithium-ion battery, a lead-acid battery, a nickel battery, a redox flow battery, or a capacitor.

As another example, some embodiments include an aircraft, specifically an electrically-powered aircraft or an electrically-powered passenger aircraft, characterized in that the latter comprises an electrochemical energy storage unit as described above.

In some embodiments, the electrochemical energy storage unit is configured for the propulsion of the aircraft.

BRIEF DESCRIPTION OF THE DRAWINGS

Further advantages, characteristics, and details of the teachings herein proceed from the exemplary embodiment described hereinafter and with reference to the drawings. In the drawings, schematically.

DETAILED DESCRIPTION

Figure 1:
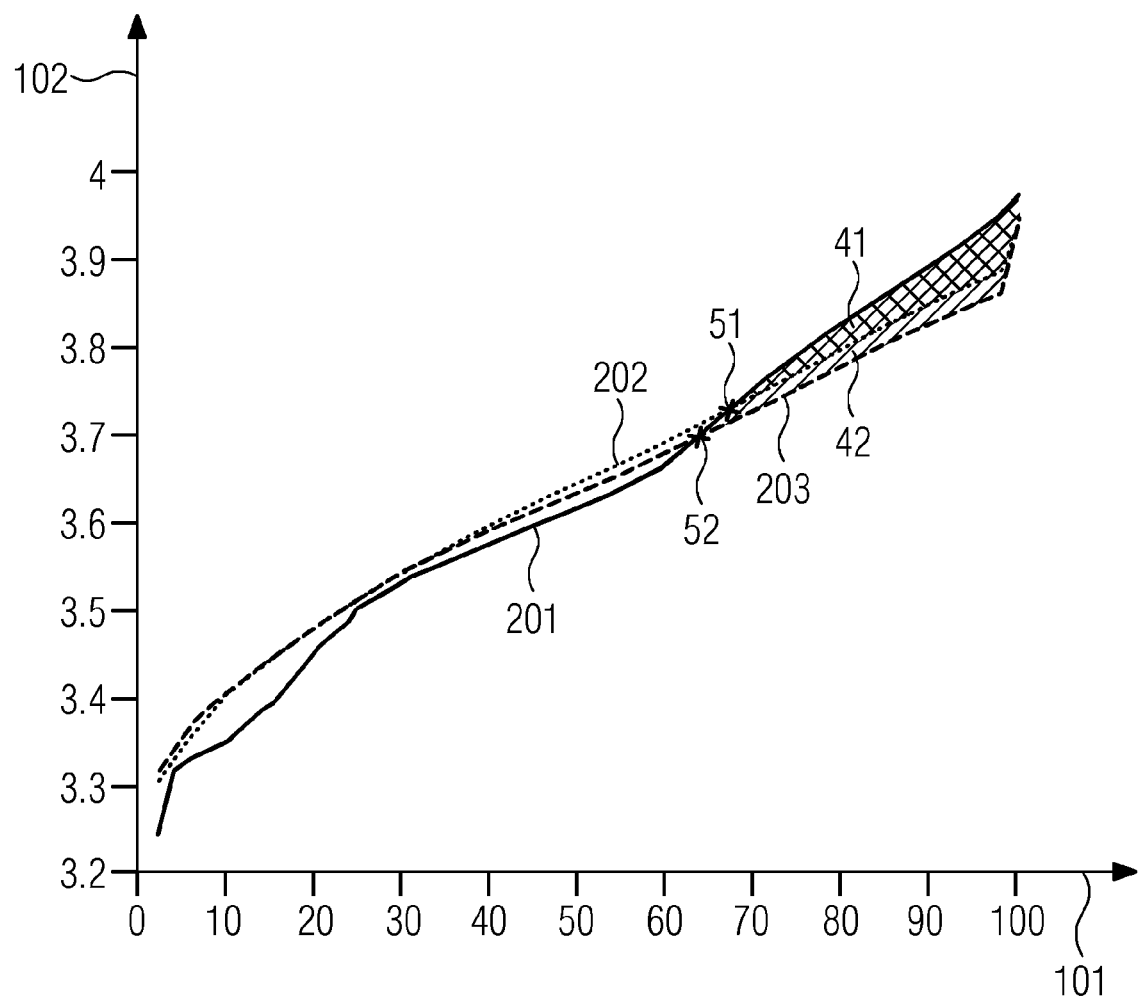
FIG. 1 shows a first diagram for determining the age of an electrochemical energy storage unit incorporating teachings of the present disclosure.

Example methods incorporating the teachings of the present disclosure for determining the age of an electrochemical energy storage unit may comprise:
- providing a first open-circuit voltage curve of the electrochemical energy storage unit, which is dependent upon the state of charge of the electrochemical energy storage unit, as a reference;
- ascertaining a second open-circuit voltage curve of the electrochemical energy storage unit, which is dependent upon the state of charge of the electrochemical energy storage unit; and
- determining the age of the electrochemical energy storage unit by comparing the first and second open-circuit voltage curves.

In some embodiments, the first open-circuit voltage curve of the electrochemical energy storage unit is provided as a reference. In particular, this curve may be determined for a new electrochemical energy storage unit, one which has yet to be operated. The first open-circuit voltage curve thus determined can thus be considered as a reference for comparison with the subsequently determined second open-circuit voltage curve. The open-circuit voltage curve of the electrochemical energy storage unit is dependent upon its age. By a comparison of the first and second open-circuit voltage curves, the age of the electrochemical energy storage unit can be determined.

The first and second open-circuit voltage curves hereby indicate the relationship of the open-circuit voltage (OCV) of the electrochemical energy storage unit to its state of charge (SOC). This relationship can be represented by means of a diagram, in the form of a curve, or determined, stored and/or saved as a functional dependency, by means of tables, matrices or similar. Determining the relationship of the open-circuit voltage of the electrochemical energy storage unit to its state of charge thus corresponds to the determination of the state of charge-dependent open-circuit voltage curve.

In some embodiments, the determination of the age of the electrochemical energy storage unit interferes to the least possible extent in the operation of the electrochemical energy storage unit. Downtimes of the electrochemical energy storage unit are reduced accordingly. Moreover, there is no additional energy consumption.

In some embodiments, the calendar age of the electrochemical energy storage unit and the cyclical age of the electrochemical energy storage unit can be determined from the comparison of the open-circuit voltage curves. Moreover, by means of a learning process, example methods permit a forecast of the potential age or aging characteristic of the electrochemical energy storage unit, and the capacity thereof. Thus, the future operation of the electrochemical energy storage unit can proceed in an optimized manner.

In some embodiments, for comparative purposes, an area between the first and second open-circuit voltage curves is considered. By this arrangement, the age of the electrochemical energy storage unit can be determined in a particularly accurate manner. This applies on the grounds that, by the determination of the age of the electrochemical energy storage unit with reference to the area between the first and second open-circuit voltage curves, a range, or at least a plurality of values on the open-circuit voltage curves are considered and/or are applied as inputs for the determination of age. As a result, the area thus determined constitutes an overall comparison of the first and second open-circuit voltage curves, with reference to said open-circuit voltage curves. Typically, the area between the first and second open-circuit voltage curves increases with the age of the electrochemical energy storage unit, such that the age thereof can be determined from this increase.

In some embodiments, said area is constituted by an integral, wherein the lower limit of the integral is determined by an intersection point of the two open-circuit voltage curves, and the upper limit of the integral is determined by at least one value for the state of charge. In some embodiments, determination of the age of the electrochemical energy storage unit is further improved accordingly. Specifically, as the lower limit of the integral, the intersection point of the two open-circuit voltage curves is considered, such that the area assumes a triangle-like or triangular geometrical shape. The intersection point thus corresponds to one value for the open-circuit voltage and one value for the state of charge of the electrochemical energy storage unit. The lower limit is thus, in turn, determined by a value of the state of charge which corresponds to the value which is associated with the intersection point. In other words, one point or one value on one of the open-circuit voltage curves, specifically an intersection point, consistently corresponds to one value of the open-circuit voltage (open-circuit voltage value) and one value of the state of charge (state of charge value).

In some embodiments, age is determined by means of a proportionality factor to said area. In other words, the larger the area, the older the electrochemical energy storage unit. If the second open-circuit voltage curve approximately corresponds to the first open-circuit voltage curve, which is considered as a reference, the difference between the two above-mentioned curves is minor, such that only a small area is constituted between the first and second open-circuit voltage curves. In other words, the electrochemical energy storage unit has only aged slightly, in relation to the first open-circuit voltage curve. If the second open-circuit voltage curve is determined at a subsequent time point, the area between the first and second open-circuit voltage curves increases, wherein this increase is directly proportional to the age of the electrochemical energy storage unit. The proportionality factor can be dependent upon the nature of the electrochemical energy storage unit and expresses the dimension of time per unit of surface area.

In some embodiments, age is determined with reference to the value for state of charge associated with the intersection point, or with reference to the value for the open-circuit voltage associated with the intersection point. Determination of the age of the electrochemical energy storage unit is further improved accordingly.

In some embodiments, an intersection point of the two open-circuit voltage curves is considered for the purposes of comparison. In some embodiments, a change in the intersection point of the open-circuit voltage curves, associated with the age of the electrochemical energy storage unit, is considered for the determination of the age thereof. This thus constitutes a local comparison, in relation to the consideration of area (global comparison).

In some embodiments, age is determined with reference to the value for state of charge associated with the intersection point, or with reference to the value for the open-circuit voltage associated with the intersection point. In some embodiments, determination of the age of the electrochemical energy storage unit is further improved accordingly.

In some embodiments, for comparative purposes, a quantitative difference is considered between an open-circuit voltage value on the first open-circuit voltage curve and an open-circuit voltage value on the second open-circuit voltage curve, at a specified common value for the state of charge. In some embodiments, a differential method (by local comparison) is thus provided for determining the age of the electrochemical energy storage unit.

In some embodiments, the specified common value for the state of charge lies within the range of 80 percent to 95 percent, specifically within the range of 85 percent to 90 percent.

In some embodiments, an electrochemical energy storage unit incorporating teachings of the present disclosure comprises a measuring device and a computing device. In some embodiments, the computing device is configured for the saving of a first open-circuit voltage curve, and the measuring device is configured for ascertaining a second open-circuit voltage curve. In some embodiments, the computing device is hereby configured to determine the age of the electrochemical energy storage unit by means of a method as described above. Identical and equivalent advantages proceed from the electrochemical energy storage unit as from the above-mentioned method.

In some embodiments, the electrochemical energy storage unit is configured as a lithium-ion battery, a lead-acid battery, a nickel battery, a redox flow battery, and/or a capacitor. In some embodiments, technically sophisticated and advanced electrochemical energy storage units can be employed accordingly. By this arrangement, moreover, potential for the integration or application of the present invention in known electrochemical energy storage units is expanded and improved.

The present teachings may be applied for battery systems, battery modules, and/or interconnected battery assemblies (in series or in parallel).

An example aircraft incorporating teachings of the present disclosure may include an electrically-powered aircraft or an electrically-powered passenger aircraft, and may comprise an electrochemical energy storage unit as described above. In some embodiments, the operational security of the aircraft, which is critical to the operation thereof, is increased, further improved and/or guaranteed accordingly. In some embodiments, the electrochemical energy storage unit described herein is employed for the propulsion of the aircraft.

To this end, the electrochemical energy storage unit may be primarily employed for driving the aircraft, wherein said unit supplies at least 50 percent of the electrical energy required for the propulsion of the aircraft. Moreover, identical and equivalent advantages proceed from the aircraft as from the electrochemical energy storage unit described herein. Advantageously, the operational security of the aircraft can be improved accordingly.

FIG. 1 shows a first diagram, which is considered for determining the age of the electrochemical energy storage unit. On the x-axis 101 of the diagram, the state of charge of the electrochemical energy storage unit is plotted as a percentage. At zero percent, the electrochemical energy storage unit is fully discharged and, at 100 percent, it is fully charged. On the y-axis 102 of the diagram, the open-circuit voltage of the electrochemical energy storage unit is plotted in volts. Moreover, for exemplary purposes, the electrochemical energy storage unit is configured here as a lithium-ion battery.

The diagram in FIG. 1 shows a first open-circuit voltage curve 201, a second open-circuit voltage curve 202 and a third open-circuit voltage curve 203. In temporal terms, the first open-circuit voltage curve 201 has been initially determined or provided for a new electrochemical energy storage unit. The second open-circuit voltage curve 202 has been determined at a subsequent time point to the first open-circuit voltage curve 201, for the same electrochemical energy storage unit. The third open-circuit voltage curve 203, with respect to the second open-circuit voltage curve 202, has been determined at a subsequent time point for the same electrochemical energy storage unit. The change in the open-circuit voltage curves 201, 202, 203 over time can clearly be seen.

The second open-circuit voltage curve 202 and the third open-circuit voltage curve 203 respectively comprise an intersection point 51, 52 with the first open-circuit voltage curve 201. Accordingly, a first area 41 is enclosed between the first open-circuit voltage curve 201 and the second open-circuit voltage curve 202, and a second area 42 is enclosed between the first open-circuit voltage curve 201 and the third open-circuit voltage curve 203. In some embodiments, the size or magnitude of the first area 41, or the size of the second area 42, is considered for the determination of the age of the electrochemical energy storage unit. Accordingly, the first area 41 between the first open-circuit voltage curve 201 and the second open-circuit voltage curve 202 and the second area 42 between the first open-circuit voltage curve 201 and the third open-circuit voltage curve 203 are larger, the greater the age of the electrochemical energy storage unit. In other words, the second area 42 is larger than the first area 41. From the size of the areas 41, 42, the age of the electrochemical energy storage unit is determined, for example by means of a proportionality factor. The size of the areas 41, 42 can be determined by means of an integral, or numerically by means of a sum, in particular a Riemann sum. As a lower limit of the integral, the respective intersection point 51, 52, or the associated state of charge value thereof, are considered. As an upper limit of the integral, a common value for the state of charge can be established, for example a state of charge of 100 percent.

Figure 2:
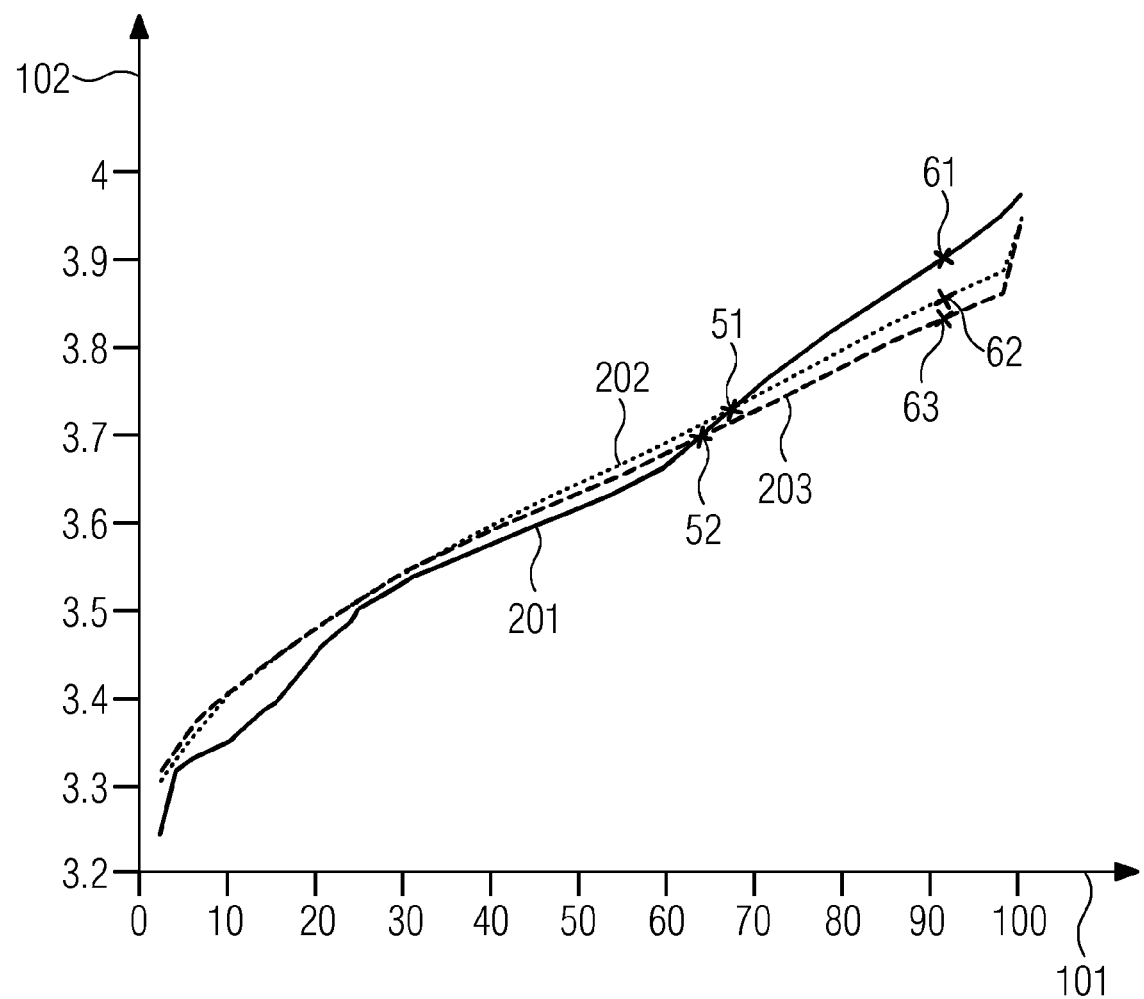
FIG. 2 shows a second diagram for determining the age of an electrochemical energy storage unit incorporating teachings of the present disclosure.

FIG. 2 shows a second diagram, which can be considered for the determination of the age of an electrochemical energy storage unit. In FIG. 2, as per FIG. 1 above, the state of charge of the electrochemical energy storage unit is plotted as a percentage on the x-axis 101. The y-axis 102 on the diagram shows the open-circuit voltage of the electrochemical energy storage unit, in volts. Again, a lithium-ion battery has been employed.

As per FIG. 1 above, the diagram represented in FIG. 2 comprises three open-circuit voltage curves 201, 202, 203. Each point on the open-circuit voltage curves 201, 202, 203 is characterized in this case by an open-circuit voltage value, and by a state of charge value for the electrochemical energy storage unit which is associated with said open-circuit voltage value. In other words, a given point on one of the open-circuit voltage curves 201, 202, 203, specifically an intersection point, is defined by two values, i.e. by a value for the open-circuit voltage and a value for the state of charge of the electrochemical energy storage unit.

For the determination of the age of the electrochemical energy storage unit, a first intersection point 51 between the first open-circuit voltage curve 201 and the second open-circuit voltage curve 202 can be considered. If the first open-circuit voltage curve 201 and the second open-circuit voltage curve 202 coincide, there is no resulting intersection point, and the electrochemical energy storage unit has thus undergone no aging. In response to the aging of the electrochemical energy storage unit, the first intersection point 51 or the second intersection point 52 are constituted, whereby a value for the open-circuit voltage and a value for the state of charge are assigned to each intersection point 51, 52. From the above-mentioned values for the open-circuit voltage and the state of charge, the aging of the electrochemical energy storage unit can be determined. Accordingly, the state of charge value assigned to the first intersection point 51 and the open-circuit voltage value assigned to the first intersection point 51 decline as the age of the electrochemical energy storage unit increases. This can clearly be seen from the position of the second intersection point 52 between the first open-circuit voltage curve 201 and the third open-circuit voltage curve 203 in relation to the position of the first intersection point 51. The third open-circuit voltage curve 203 has been hereby determined at a subsequent time point to the second open-circuit voltage curve 202.

In some embodiments, reference to a differential in values for the open-circuit voltage value assigned to the open-circuit voltage curves 201, 202, 203. A common state of charge value, or value for the state of charge of the electrochemical energy storage unit, is hereby established. In the diagram represented, a common value for the state of charge of approximately 92% is established. A respective associated value for the open-circuit voltage, given by the y-axis in the diagram represented, corresponds to this value for the state of charge. The points 61, 62, 63 on the corresponding open-circuit voltage curves 201, 202, 203 are generated accordingly. From the quantitative difference between values for the open-circuit voltage assigned to the points 61, 62, 63, the age of the electrochemical energy storage unit can be determined.

For example, the value for the open-circuit voltage assigned to point 62 is subtracted from the value for the open-circuit voltage assigned to point 61. From this numerical difference, which is proportional to the age of the electrochemical energy storage unit, the age of the electrochemical energy storage unit can be determined. An analogous method is applied for point 63, i.e. the value for the open-circuit voltage assigned to point 63 is subtracted from the open-circuit voltage value at point 61 wherein, in turn, the magnitude of this difference is proportional to the age of the electrochemical energy storage unit. Point 61 on the first open-circuit voltage curve 201 is thus considered as a reference.

The open-circuit voltage curves 201, 202, 203 can be determined by the application of a current count rate of less than 0.1, by the calculation of an open-circuit voltage curve from the average value of charging and discharging curves with equal rates of charging and discharging, or from an open-circuit voltage value after a waiting time or response time of the voltage at a current loading of I=0. Values for the open-circuit voltage on the respective open-circuit voltage curves 201, 202, 203 are assigned to the respective value for the state of charge of the electrochemical energy storage unit, thereby generating the diagrams represented in FIG. 1 or FIG. 2.

Although the teachings herein have been illustrated and described in greater detail with reference to the exemplary embodiments, the invention is not limited by the examples disclosed, and other variations can be respectively inferred by a person skilled in the art without departing from the scope of protection of the invention.

What is claimed is:

1. An electrochemical energy storage unit comprising:
a measuring device; and
a computing device including a processor;
wherein the computing device stores a first open-circuit voltage curve;
the measuring device determines a second open-circuit voltage curve; and
the computing device determines an age of the electrochemical energy storage unit by executing instructions, the instructions configuring the processor to:
refer to a first open-circuit voltage curve of the electrochemical energy storage unit dependent upon the state of charge of the electrochemical energy storage unit as a reference;
ascertain a second open-circuit voltage curve of the electrochemical energy storage unit dependent upon the state of charge of the electrochemical energy storage unit; and
determine the age of the electrochemical energy storage unit by comparing the first and second open-circuit voltage curves and applying a proportional factor to the result of the comparison.

2. The electrochemical energy storage unit as claimed in claim 1, further comprising at least one storage selected from the group consisting of: a lithium-ion battery, a lead-acid battery, a nickel battery, a redox flow battery, and a capacitor.

3. The electrochemical energy storage unit as claimed in claim 1, wherein comparing the first open-circuit voltage curve and the second open-circuit voltage curve includes determining an area between the first open-circuit voltage curve and the second open-circuit voltage curve.

4. The electrochemical energy storage unit as claimed in claim 3, wherein determining the area includes calculating an integral, wherein the lower limit of the integral is determined by an intersection point of the two open-circuit voltage curves and the upper limit of the integral is determined by at least one value for the state of charge.

5. An aircraft comprising:
an electrochemical energy storage unit for driving the aircraft;
a measuring device; and
a computing device including a processor;
wherein the computing device stores a first open-circuit voltage curve;
the measuring device determines a second open-circuit voltage curve; and
the computing device determines an age of the electrochemical energy storage unit by executing instructions, the instructions configuring the processor to:
refer to a first open-circuit voltage curve of the electrochemical energy storage unit dependent upon the state of charge of the electrochemical energy storage unit as a reference;
ascertain a second open-circuit voltage curve of the electrochemical energy storage unit dependent upon the state of charge of the electrochemical energy storage unit; and
determine the age of the electrochemical energy storage unit by comparing the first and second open-circuit voltage curves and applying a factor to the result of the comparison.

6. The aircraft as claimed in claim 5, characterized in that the electrochemical energy storage unit propels the aircraft.

7. The aircraft as claimed in claim 5, wherein comparing the first open-circuit voltage curve and the second open-circuit voltage curve includes determining an area between the first open-circuit voltage curve and the second open-circuit voltage curve.

8. The aircraft as claimed in claim 5, wherein determining the area includes calculating an integral, wherein the lower limit of the integral is determined by an intersection point of the two open-circuit voltage curves and the upper limit of the integral is determined by at least one value for the state of charge.

\* \* \* \* \*